United States Patent [19]

Nilsson

[11] Patent Number: 4,466,676
[45] Date of Patent: Aug. 21, 1984

[54] ARRANGEMENT FOR A CABINET HAVING A DOOR WHICH CAN BE SWUNG OUTWARDS FROM THE CABINET AROUND EITHER OF TWO OPPOSING EDGES

[75] Inventor: Nils A. Nilsson, Glanshammar, Sweden

[73] Assignee: Förenade Fabriksverken, Eskilstuna, Sweden

[21] Appl. No.: 490,887

[22] Filed: May 2, 1983

[30] Foreign Application Priority Data

May 4, 1982 [SE] Sweden .............................. 8202771

[51] Int. Cl.³ ........................................... A47B 81/00
[52] U.S. Cl. .................................. 312/283; 312/222;
312/138 R; 16/231; 16/DIG. 23; 49/193
[58] Field of Search .................. 312/283, 138 R, 139,
312/216, 217, 218, 222, 100, 287, 296, 297, 215;
49/382, 193; 16/230, 231, DIG. 23, 389, 390,
391, 392, 282, 287, 302

[56] References Cited

U.S. PATENT DOCUMENTS

| | | | |
|---|---|---|---|
| 404,590 | 6/1889 | Binsfeldt et al. | 16/230 |
| 2,274,106 | 2/1942 | Strong et al. | 312/100 |
| 2,650,388 | 9/1953 | White | 16/230 |
| 2,835,546 | 5/1958 | Rothschild | 312/287 X |
| 3,018,741 | 1/1962 | Loomis et al. | 16/230 X |
| 3,376,086 | 4/1968 | Fisher | 312/100 |
| 3,506,326 | 4/1970 | Tantillo | 16/389 X |
| 3,733,749 | 5/1973 | Parera | 49/193 |
| 3,889,419 | 6/1975 | Maleck | 49/382 X |
| 4,003,610 | 1/1977 | Main | 312/100 |
| 4,132,034 | 1/1979 | Van Siclen | 49/382 |

FOREIGN PATENT DOCUMENTS

| | | | |
|---|---|---|---|
| 1578724 | 10/1967 | France | 49/382 |
| 1182394 | 2/1970 | United Kingdom | 16/230 |

Primary Examiner—William E. Lyddane
Assistant Examiner—Thomas A. Rendos
Attorney, Agent, or Firm—Fleit, Jacobson, Cohn & Price

[57] ABSTRACT

Arrangement for cabinet with a door which can be opened at either of two opposing edges. At each of the opposing edges the door is hingedly connected with a side flap which when opened permits access to material stored in the cabinet. Each side flap is capable of being locked to the cabinet by means of two locking devices. When an arbitrary pair of locking devices is unlocked the door together with one side flap can be swung outwards from the cabinet.

7 Claims, 2 Drawing Figures

ARRANGEMENT FOR A CABINET HAVING A DOOR WHICH CAN BE SWUNG OUTWARDS FROM THE CABINET AROUND EITHER OF TWO OPPOSING EDGES

The present invention relates to an arrangement for a cabinet with a door which can be swung outwards from the cabinet around either of two opposing edges.

In the case of cabinets containing fixed equipment, e.g. electronic equipment, access to the equipment is rendered difficult if the doors of the cabinet can be swung outwards only from one side of the cabinet. With conventional cabinets, so as to increase accessibility, either the number of doors on the cabinet has been increased and/or the door has been given such a mounting that it can be opened at either of two opposing edges. Examples of such mounting are illustrated in for example U.S. Pat. specification No. 3,733,749. The latter-mentioned, known mounting suffers however from the disadvantage that in the course of time the mounting arrangement becomes worn out, so that there is a risk that the door will collapse from the cabinet.

Hence the aim of the present invention is to provide a cabinet of the type described in the preamble which on the one hand provides improved accessibility to material stored in the cabinet, and which also has a long service life. This aim is achieved in that the cabinet in accordance with the invention is given the characteristics specified in claim 1.

Further embodiments of the invention are described in the subclaims.

The invention will be described in greater detail by reference to the appended drawings which illustrate a preferred embodiment of the invention.

Figure 1:
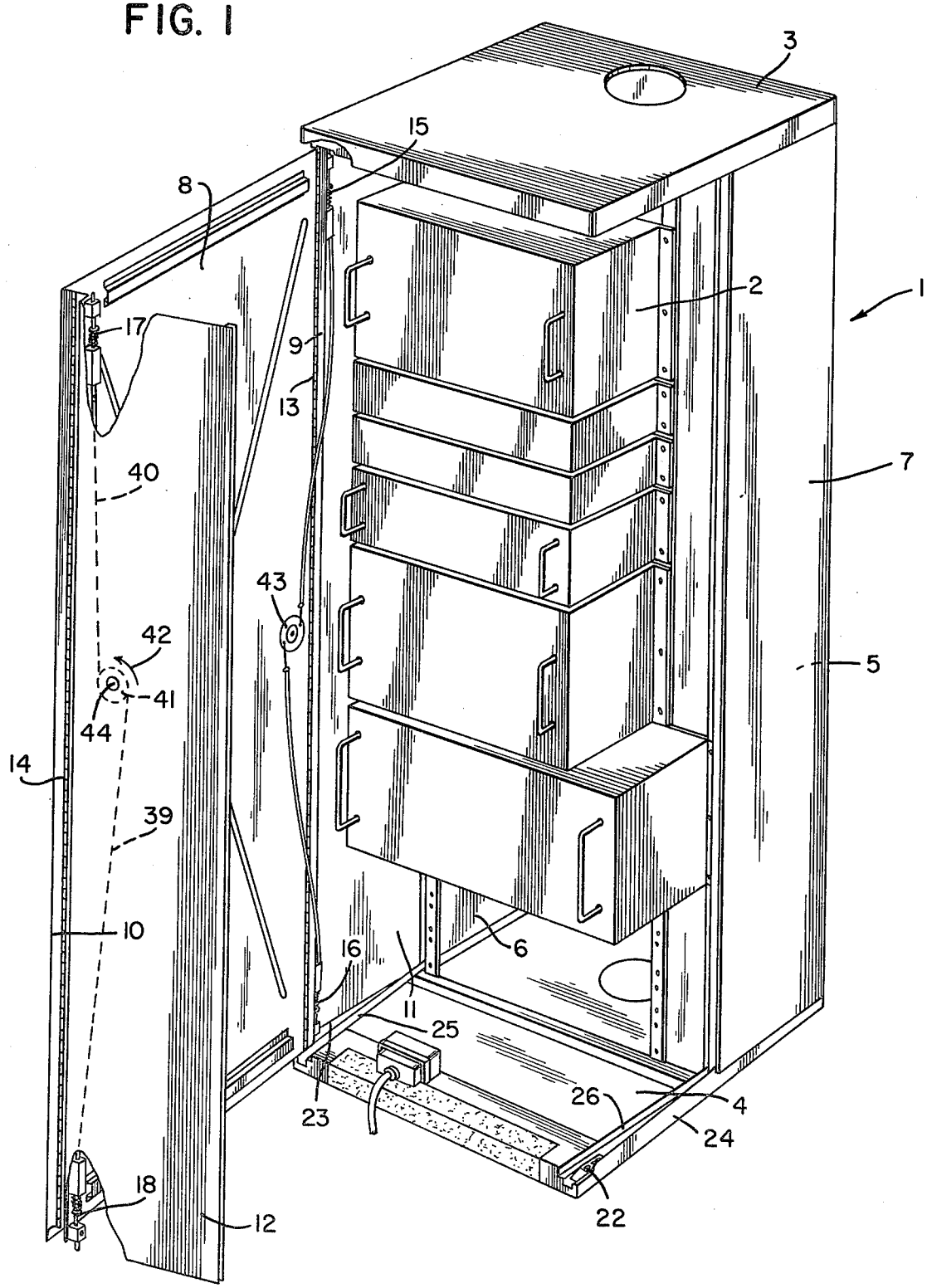
FIG. 1 illustrates the equipment cabinet in accordance with the invention in a perspective view from the front.

FIG. 1 illustrates an equipment cabinet 1, shown in its entirety and made of steel or aluminium or other suitable metal, which contains electronic equipment 2 of an unspecified type. The cabinet 1 is provided with a square top 3, a square base 4, a rear portion 5, plus two side walls 6 and 7, which extend only half way from the rear portion 5 of the cabinet to its front. The cabinet also has a door comprising a vertical door leaf 8, the vertical opposing edges 9 and 10 respectively of which are each hinge connected with their side flaps 11 and 12 respectively by means of a piano type hinge 13 and 14 respectively.

On each side flap 11 and 12 respectively a locking device is mounted, each of which comprises a spring-loaded upper locking pin 15 and 17 respectively, also a spring-loaded lower locking pin 16 and 18 respectively, for interaction with a corresponding hole 19, 20, 21 and 22 respectively in the top 3 of the cabinet and the base 4. (To facilitate clarity in the drawing only the hole 22 is shown.)

When the door is closed, all pins 15–18 are introduced in the corresponding holes 19–22. The pins 15–18 form locking bolts of which a random pair of bolts 15, 16 and 17, 18 can be unlocked, i.e. enabling the door to be opened to the left or to the right. Either the pair of pins (bolt pair) 17–18 is unlocked so that the door as shown in FIG. 1 together with the appended side flap 12 can be swiveled outwards around the hinge 13 which functions as the rotational member for the door, or alternatively the pair of pins 15–16 can be unlocked so that the door together with the other side flap 11 can instead be swung outwards around the hinge 14, which then acts as the rotational member for the door.

As the door opens one of the side flaps 11 and 12 runs in a guide rail 23 and 24 respectively in the bottom of the cabinet 4. Similar guide rails are preferably also arranged in a corresponding manner in the top of the cabinet 3. So as to avoid the side flaps 11 and 12 jamming in the guide rails 23 and 24 respectively, these have a guide surface 25 and 26 respectively which is located at an oblique angle with respect to the side walls 6 and 7.

Hence the door can be opened either to the right or to the left dependent on which locking pin pair 15–16 and 17–18 is opened. Naturally it is also possible to lift off the door completely by releasing all the pins 15–18.

Because the side flaps 11, 12 are hinged at the door leaf 8, they can be folded backwards fully towards this so that the door leaf with its side flaps occupies minimum space when lifted off.

Figure 2:
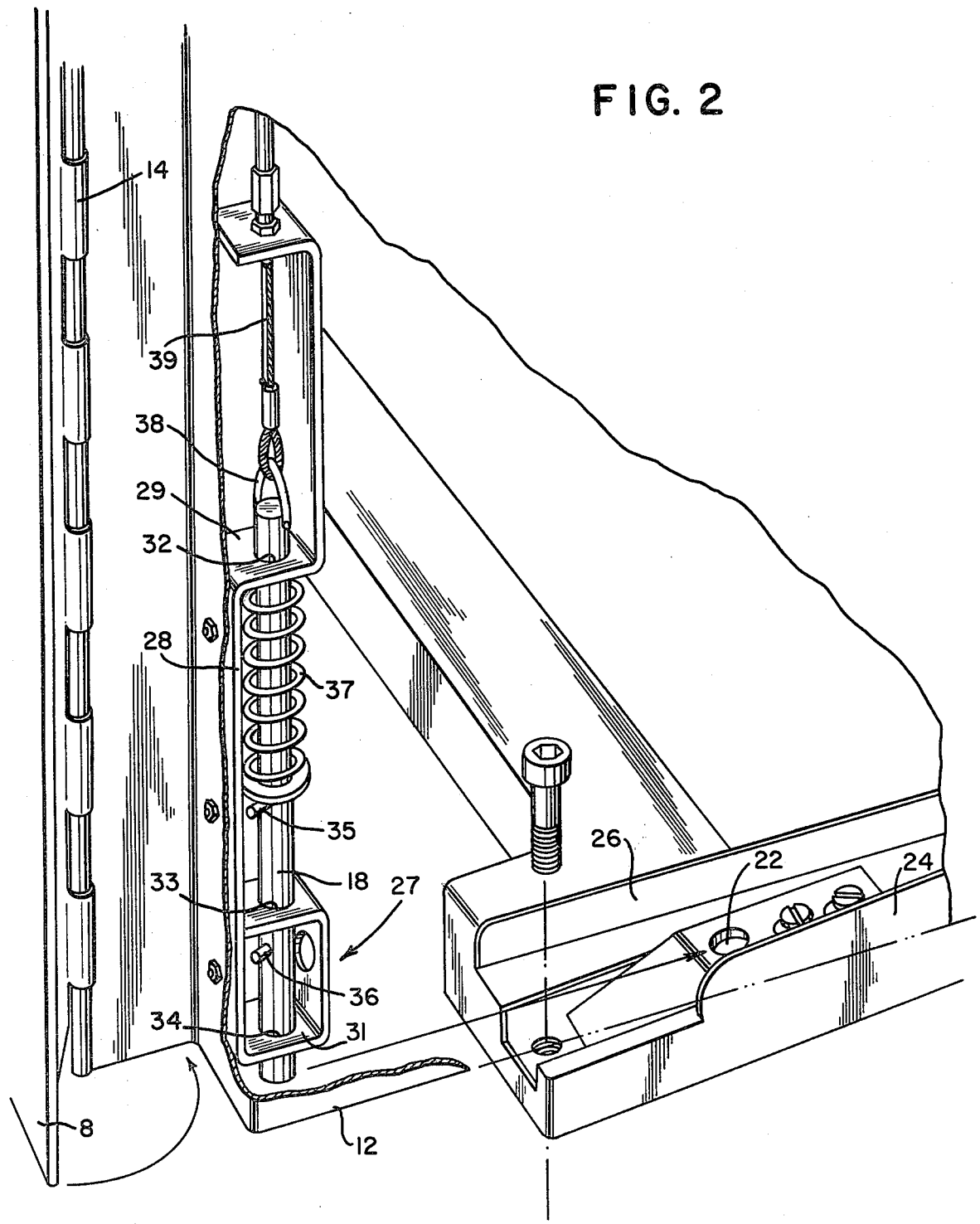
FIG. 2 shows on an enlarged scale a perspective view of a locking device forming part of the cabinet.

The nature and function of the locking pins 15–18 is illustrated in greater detail in FIG. 2 which shows the lower pin 18 of the identical pins 16 and 18. (The nature and function of the upper pins 15 and 17 correspond to that of the lower pins, so that these do not need to be described in greater detail.)

Each pin or stud 15–18 is movable in the vertical plane in each of its respective corners, which face the door, of the housing 27 which is attached to the inside of the side flap. The housing 27 which is rivetted against a section 11a, bent inwards at a 90° angle (or 12a, which is not shown), on the side flap 11 (or 12 respectively) consists of a long narrow strip of plate 28 which is bent through 90° close to its upper end to form a horizontal upper wall 29 which projects from the side flap, and whose lower end is curved around in three stages each of 90° to form a horizontal intermediate wall 30 projecting from the side flap and a horizontal lower wall 31 projecting from the side flap. Each wall 29–31 has a central, through aperture 32, 33 or 34, located centrally with respect to the others, through which the stud 18 passes. The stud 18 is provided with an upper and a lower stop pin 35 and 36 respectively, which when the stud 18 is displaced vertically are designed to impact against the upper and lower face respectively of the intermediate wall 30 so as to restrict the movement of the stud. The portion of the stud 18 situated between the upper wall 29 and the upper stop pin 35 is surrounded by a spiral spring 37 which strives to force the stud 18 downwards to achieve interlocking engagement with corresponding hole 22 in the base of the panel.

The upper end of the stud 18 is, like the lower end of the stud 17, provided with a supporting eye 38 (see FIG. 2) which via a cable 39 and 40 respectively (see FIG. 1) is connected with a lock actuating device attached to the door leaf 8 in the form of a handle 41 which is accessible to an operator from the outside of the door leaf 8. When the handle 41 is turned in the direction shown by arrow 42 the stud 18 is drawn upwards and the stud 17 downwards against the action of the respective spiral spring 37. The door can now be swung in towards the panel until the studs 17 and 18 reach the centre of the holes 21 and 22 in the top and base respectively of the panel. If the handle 41 is subsequently turned in a direction opposite to direction 42, the studs 17 and 18 proceed downwards into holes 21 and 22 to achieve interlocking engagement. The handle 41 is preferably provided with suitable lock 44, shown schematically, so that accidental opening of the door is prevented. The lock 44 can be a conventional cylinder lock which in the locked position prevents turning of the handle 41.

The function of studs 15 and 16 is identical with that of studs 17 and 18. Studs 15 and 16 are also connected with a handle 43 in the same way as are studs 17 and 18.

I claim:

1. A cabinet having a door (8) with opposing edges (9, 10) which can be swung outwards from the cabinet around either of the two opposing edges (9, 10), characterised in that each of the opposing edges (9, 10) is connected with a side flap (11, 12) by the hinge member (13, 14), said side flaps respectively forming a wall portion in each of two side walls (6, 7) in the cabinet, and wherein each side flap (11, 12) has at least one locking device (15, 16 and 17, 18 respectively) for locking the side flaps to the cabinet whereby unlocking of the locking device (17, 18) on one of the side flaps (11, 12) permits the door (8) together with the said one side flap (11, 12 respectively) to be swung outwardly from the cabinet around the hinge member (13, 14) which connects the door (8) with the other side flap.

2. A cabinet as in claim 1, characterised in that the cabinet has a top (3) and a base (4) and that guide rails (23, 24) for the side flaps (11, 12) are provided in at least one of the top and the base.

3. A cabinet as in claim 2, characterised in that each of the guide rails (23, 24) has a guide surface (25, 26) which is located obliquely relative to the side walls (6, 7) of the cabinet.

4. A cabinet in accordance with claim 1, characterised in that the hinge members (13, 14) are formed from piano hinges.

5. A cabinet in accordance with claim 1, characterised in that the locking device comprises studs (15–18), slidably mounted on the respective side flap which are displaceable against the action of a spring (37) in and out of a corresponding hole (19–22) in the cabinet.

6. A cabinet as in claim 5, characterised in that each stud (15–18) is connected by means of a cable (39, 40) with a lock actuating device (41, 43) which is assigned to a corresponding side flap (11 and 12 respectively).

7. A cabinet as in claim 6, characterised in that the lock actuating device comprises a handle (41, 43) provided with a lock (44) for locking the handle to prevent accidental turning.

* * * * *